United States Patent [19]
Koide et al.

[11] 4,066,350
[45] Jan. 3, 1978

[54] CHARACTER DISPLAY AND INPUT DEVICE

[75] Inventors: Hiroshi Koide; Katsuhiko Iida; Hisanori Ataka; Taisaburo Homae, all of Tokyo, Japan

[73] Assignee: Ricoh Company, Ltd., Tokyo, Japan

[21] Appl. No.: 611,577

[22] Filed: Sept. 8, 1975

[30] Foreign Application Priority Data

Sept. 9, 1974 Japan .................................. 49-103579

[51] Int. Cl.² ........................ G03B 23/08; G03B 21/14
[52] U.S. Cl. ...................................... 353/27 R; 353/38
[58] Field of Search ..................... 353/25, 27 R, 27 A, 353/38

[56] References Cited

U.S. PATENT DOCUMENTS

| 3,528,735 | 9/1970 | Bluitt et al. | 353/27 A |
| 3,809,468 | 5/1974 | Moritz | 353/26 A |
| 3,820,884 | 6/1974 | Sone et al. | 353/26 A |
| 3,853,395 | 12/1974 | Yevick | 353/27 R |
| 3,864,034 | 2/1975 | Yevick | 353/27 R |
| 3,951,532 | 4/1976 | Kropp | 353/25 |

*Primary Examiner*—Steven L. Stephan
*Attorney, Agent, or Firm*—Frank J. Jordan

[57] ABSTRACT

A large number of characters are formed on a sheet such as microfiche. The characters are further divided into classes such as a class of Roman alphabet characters, a class of Japanese hiragana characters, a class of Japanese katakana characters and a plurality of classes of Chinese characters arranged phonetically according to their leading syllables. Each class contains a predetermined number of characters. The characters are arranged in an alternating arrangement on the microfiche which is movable relative to a mask formed with apertures in such a manner that at each position of the microfiche all of the characters of a corresponding class are displayed through the respective apertures of the mask. Class selection means comprising one or more switches control drive means to move the microfiche so that the desired class of characters is displayed. Character selection means allow selection of the desired character and feed an electrical signal corresponding thereto to an electric typewriter, computer, teletype device or the like. The character selection means may comprise a light pen or switches provided to the respective apertures of the mask.

17 Claims, Drawing Figures

CHARACTER DISPLAY AND INPUT DEVICE

The present invention relates to a device for displaying only a selected class of a large number of characters and producing an electrical signal representing a selected character from the selected class.

In parallel with the development of electric typewriters, computers, printers, ticket vending machines, inventory systems and the like has emerged the need for input devices which are adapted to enter a selected one of a tremendous number of data items into the system. A typical application to which the present invention is particularly suited is an input device for a system for transmitting both Japanese and Roman characters. Although there are only 26 Roman characters which can be easily input by a well known keyboard, the Japanese written language comprises katakana phonetic characters for writing non-Japanese words, hiragana phonetic characters for writing Japanese words and thousands of kanji (Chinese) characters which are combined with the hiragana characters in writing Japanese words. In an input device for a system to transmit both Japanese and Roman characters, the number of characters which must be input into the system is generally as high as 3000 or 4000.

A prior art device for inputting such a large number of characters comprises a cathode ray tube to display all or a large number of the characters and a light pen to designate the character to be input. The disadvantages of this system are the high cost of the cathode ray tube and the exceedingly complex circuit required for the input and control functions.

In another prior art system, the characters are printed on the circumference of a drum in rows, and the drum is rotated to find the row which contains the desired character. Each row contains a predetermined number of characters, and a keyboard is provided with a key for each character in the row. This system is disadvantageous in that the device is large in size and the number of characters which it can accomodate is limited.

In another prior art system, the characters are provided on a number of cards or sheets. However, the system must comprise a complicated mechanism to select the desired card and the system is subject to mechanical failures such as jamming of the cards. The size of the system must also be quite large.

Yet another system comprises a microfilm strip on which the characters are provided. The disadvantage of this system is that in order to provide a large number of characters the microfilm strip must be quite long, resulting in excessive access time.

It is therefore an important object of the present invention to provide a character display and input device which overcomes the drawbacks of the prior art.

It is another important object of the present invention to provide a character display and input device which comprises a microfiche sheet on which a large number of characters is provided, the characters being divided into clases and only one class being displayed at one time.

It is another object of the present invention to provide a character display device in which characters in different classes are arranged in an alternating arrangement on a microfiche sheet.

It is another object of the present invention to provide a character display and input system in which only a selected character is blanked out on a display screen after selection.

It is another object of the present invention to provide a character display and input device which displays an index of the classes of characters provided, means for selecting the desired class which is thereafter displayed, and means for selecting the desired character from the selected class.

The above and other objects, features and advantages of the present invention will become clear from the following detailed description taken with the accompanying drawings, in which.

Figure 1A:
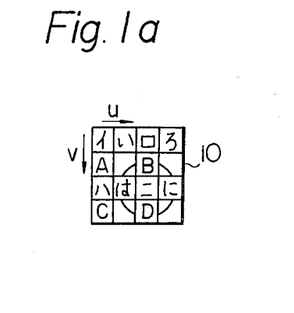
FIGS. 1(a) 2(b), and 2(a), 2(b) 2(c) and 2(d) are diagrams illustrating the principle of the invention.

The basic principle of the invention will now be described with reference to FIG. 1. In FIG. 1a is shown a microfiche sheet 10 on which are formed or printed 16 characters. The characters are of four different classes; Japanese katakana (phonetic alphabet for writing non-Japanese words), Japanese hiragana (phonetic alphabet for writing Japanese words) Roman alphabet and sections of a quadrisected circle. Reading from left to right, top to bottom, the characters are katakana "i", hiragana "i", katakana "ro", hiragana "ro", Roman "A", the upper left quadrant of a circle, Roman "B", the upper tight quadrant of a circle, katakana "ha", hiragana "ha", katakana "ni", hiragana "ni", Roman "C", the lower left quadrant of a circle, Roman "D" and the lower right quadrant of a circle. It will be noted that there are four classes of characters, with each class containing four characters.

Figure 1B:
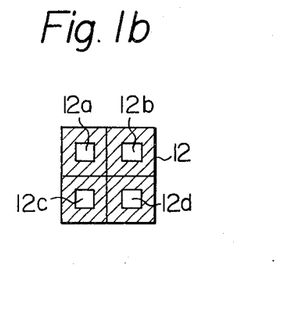

In FIG. 1b is shown a mask 12 formed with four apertures 12a, 12b, 12c and 12d. Although in the actual device the apertures are much larger than the characters and lenses are provided to magnifyingly project the characters through the mask onto a screen as will be described in detail below, for simplicity of presentation of the basic principle of the invention it will be assumed that only the sheet 10 and mask 12 are provided and that the characters are of the same size as the apertures and are visible therethrough.

Figure 2A:
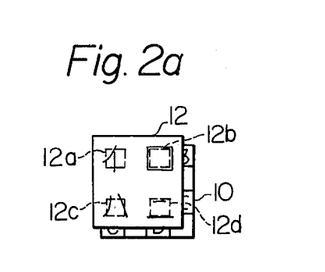
Figure 2B:
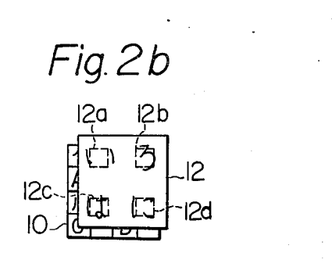
Figure 2C:
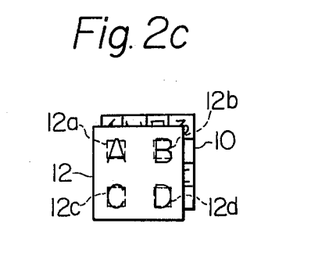
Figure 2D:
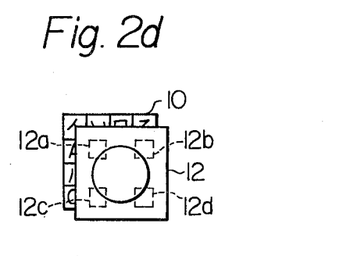

The mask 12 is movable relative to the sheet 10 to one of four predetermined positions corresponding to the four classes of characters. When the mask 12 is an upper leftward position relative to the sheet 10 as shown in FIG. 2a, the four katakana characters "i", "ro", "ha" and "ni" are visible through the apertures 12a, 12b, 12c and 12d respectively. When the mask 12 is in an upper rightward position relative to the sheet 10 as shown in FIG. 2b, the four hiragana characters "i", "ro", "ha" and "ni" are visible through the apertures 12a, 12b, 12c and 12d respectively. When the mask 12 is in a lower leftward position relative to the sheet 10, the four Roman characters "A", "B", "C" and "D" are visible through the apertures 12a, 12b, 12c and 12d respectively. When mask 12 is in a lower rightward position relative to the sheet 10, the upper left, upper right, lower left and lower right quadrants of the circle are visible through the apertures 12a, 12b, 12c and 12d respectively. Within the scope of the invention, the mask 12 may be held stationary and the sheet 10 moved relative thereto, the sheet 10 may be held stationary and the mask 12 moved relative thereto or both the sheet 10 and the mask 12 may be moved to produce relative movement therebetween to the desired relative position. In the embodiments of the invention which are described in detail below, the mask 12 is held stationary while the sheet 10 is moved relative thereto.

The number of classes of characters which can be displayed with a particular configuration is referred to as a "display segment", with the number of display segments being equal to the number of predetermined positions of the mask 12 relative to the sheet 10. The characters themselves are referred to as "recording segments". The number of display segments is equal to the number of recording segments divided by the number of apertures in the mask. A U-direction is defined as left to right and a V direction is defined as top to bottom as indicated in FIG. 1a.

Figure 3:
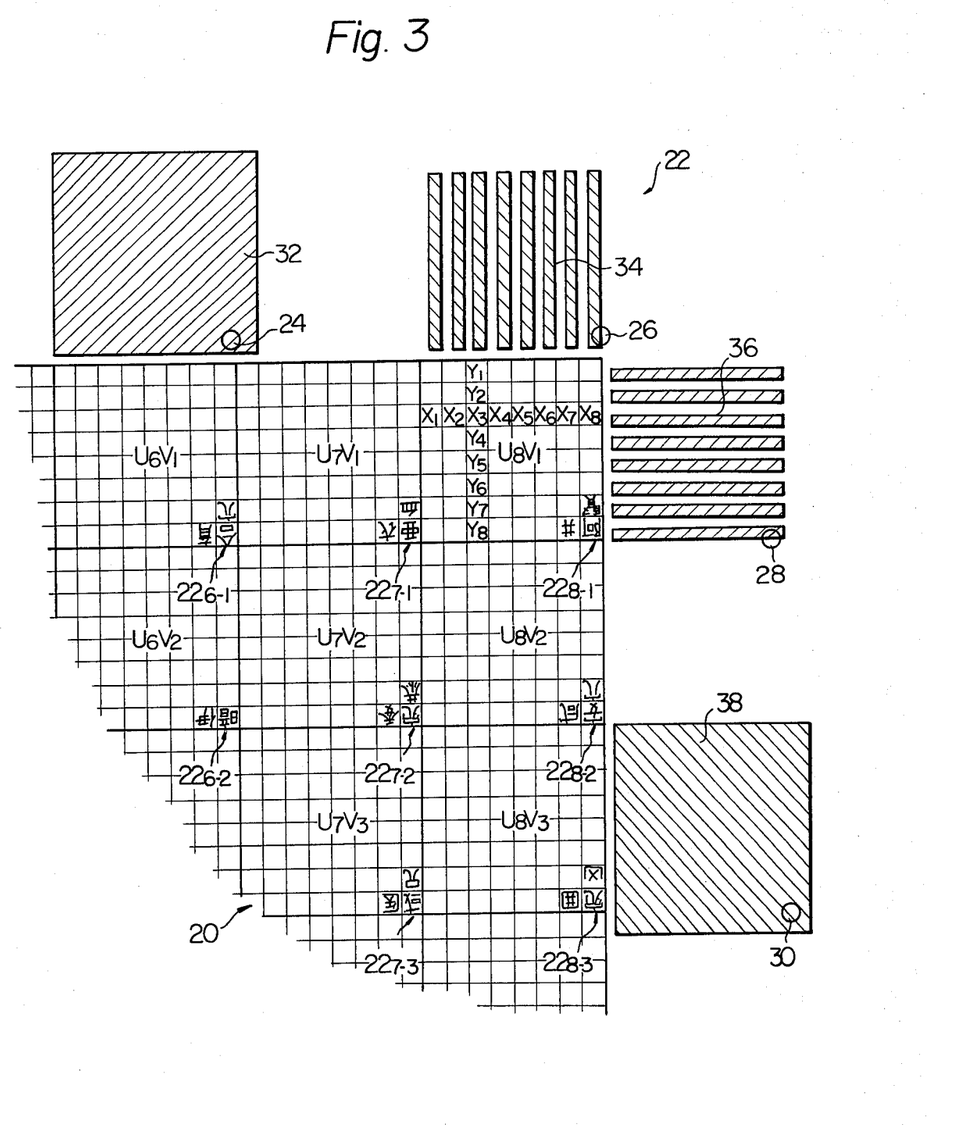
FIG. 3 is a diagram illustrating the arrangement of characters on a microfiche sheet constituting part of the present device.

Referring now to FIG. 3, a practical microfiche sheet 20 is shown in fragmentary form, which is capable of displaying 4096 characters in 64 classes. Although the entire sheet 20 is not shown for simplicity of illustration, the characters are divided into the following classes.

1. Alphanumeric - 16 classes - including the Roman alphabet, numerals symbols and other requried characters.
2. Katakana - one class.
3. Hiragana - one class.
4. Kanji (Chinese characters) - 46 classes - arranged phonetically according to the leading syllable.

The microfiche 20 in the illustrated embodiment is square, and is octasected both vertically and horizontally to form 64 sections which are designated as $U_1V_1$ to $U_8V_8$. Each section is further octasected horizontally and vertically to form 64 subsections or recording segments designated as $x_1y_1$ to $x_8y_8$. A mask 22 is formed with 64 apertures designated as $22_{1-1}$ to $22_{8-8}$ corresponding to the respectively numbered sections $U_1V_1$ to $U_8V_8$. One character is provided on each recording segment and one character is visible through each aperture. The mask 22 is fixed and the sheet 20 is movable. The general term "character" used herein refers to any type of figure which may be formed on a recording segment of a microfiche and includes pictures and the like.

The sheet 20 is shown in FIG. 3 in an upper leftmost position in which the lower rightmost characters in each section are visible through the respective apertures. In the example shown, the characters visible in this position constitute a class of Kanji (Chinese characters), each of which has a leading syllable pronounced "a".

The microfiche sheet 20 is further provided with dark portions 32 and 38 and striped portions 34 and 36 which are associated with fixed sensors 24, 26, 28 and 30 as will be described in detail below. The striped portion 34 is formed with 8 dark stripes (no numerals) which are associated with the horizontal recording segment positions $x_1$ to $x_8$ of the sheet 20. With the sheet 20 in the leftmost position as shown in FIG. 3, the rightmost stripe of the striped portion 34 is adjacent to the sensor 26. As the sheet 20 is moved rightward, the succeeding stripes of the striped portion 34 are moved adjacent to the sensor 26 as the respective recording segments $x_7$ to $x_1$ are visible in the apertures. The stripes of the striped portion 36 have a similar relationship with regards to the sensor 28 and the vertical recording segment positions $y_1$ to $y_8$. It will thus be understood that the sheet 20 may assume 64 predetermined positions relative to the mask 22, in each of which one of the 64 recording segments of each of the 64 sections is visible through the respective aperture in the mask corresponding to the section. A total of 64 characters (the characters of one class) is therefore visible in each position of the sheet 20.

Figure 4:
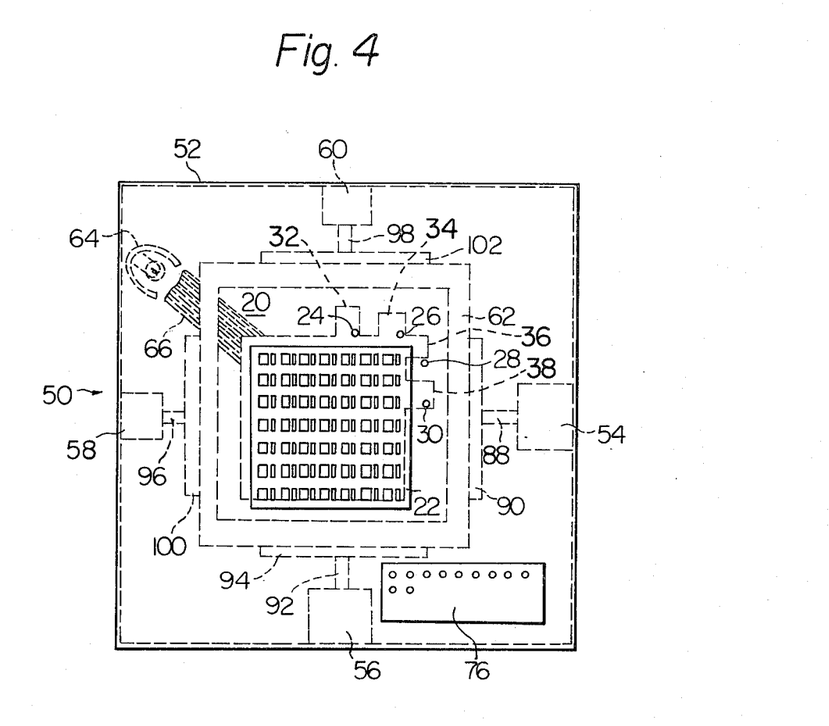
FIG. 4 is an overhead plan view of one embodiment of the present device, partly in section.

A device for displaying information such as characters and producing electrical output signals corresponding to selected characters is schematically shown in FIG. 4 and generally designated as 50. The electrical signals may be fed to an electric typewriter, an electronic computer, a teletype system or the like. The device 50 comprises a housing 52 which supports actuators 54 and 56 and supports 58 and 60, which in turn movably support a table 62 which holds the microfiche sheet 20. The housing 52 also supports the mask 22 which is disposed above the sheet 20. A light source 64 is provided in the housing 52 and fiber optic tubes collectively designated as 66 pipe light from the light source 64 to the sheet 20.

Figure 5:
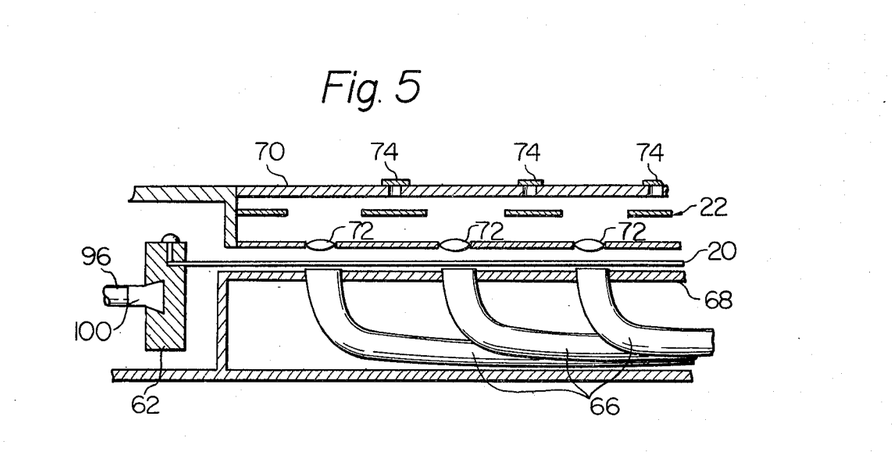
FIG. 5 is a partial longitudinal section of the device shown in FIG. 4.
Figure 6:
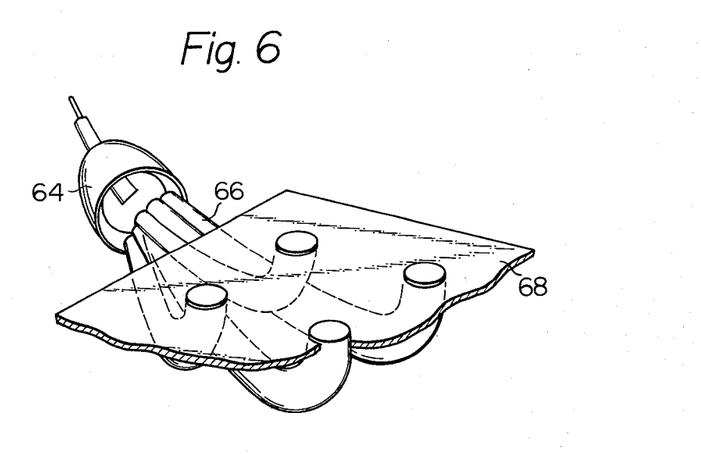
FIG. 6 is a perspective view of part of a light source means of the present device.

Referring also to FIGS. 5 and 6, the ends of the tubes 66 are supported by a plate 68 so that they are aimed upwards toward the sheet 20. A total of 64 tubes 66 is provided, with one tube 66 being associated with each aperture in the mask 22.

Figure 7:
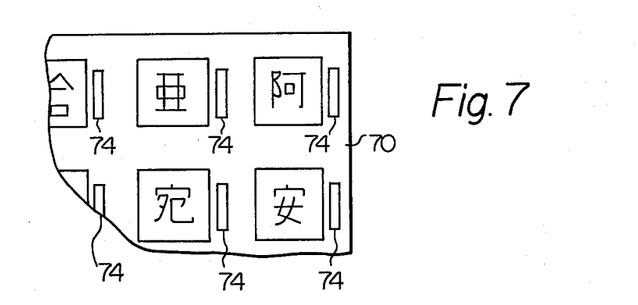
FIG. 7 is a partial schematic view illustrating characters displayed by the device.

As best seen in FIG. 5, 64 lenses collectively designated as 72 are provided between the ends of the tubes 66 and the respective apertures in the mask 22. Above the mask 22 is a translucent screen 70. Each unit of a tube 66, lens 72 and aperture in the mask 22 constitutes a projector to project an image of one character on the sheet 20 onto the screen 70, preferably with high magnification in order to increase the recording density of characters on the sheet 20. The appearance of the projected characters on the screen 70 is shown in FIG. 7.

In the embodiment shown, 64 switches collectively designated as 74 are provided on the screen 70 next to the positions where the respective characters are projected, whose function will be described below. Also shown in FIG. 4 is a switch panel 76 comprising 64 switches.

Figure 9:
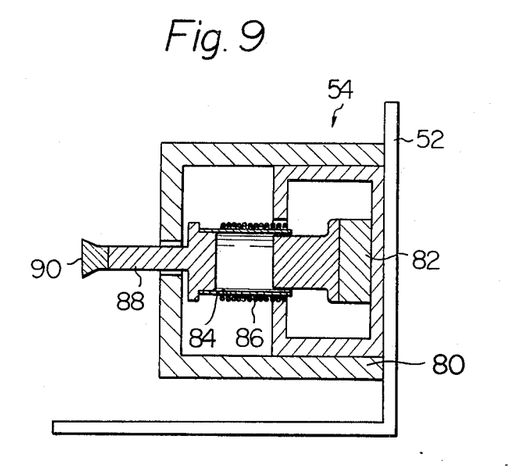
FIG. 9 is a schematic view showing actuating means for moving the table.

The actuators 54 and 65 are identical, and a cross section of the actuator 54 is shown in FIG. 9. The actuator 54 comprises a casing 80 with a magnetic core 82 fixed therein. A sleeve 84 made of an insulating material is slidable on the core 82 and has a coil 86 wound thereon. A rod 88 is fixed to the sleeve 84 for movement therewith and carries a dovetail-section bar 90 at its end.

Figure 8:
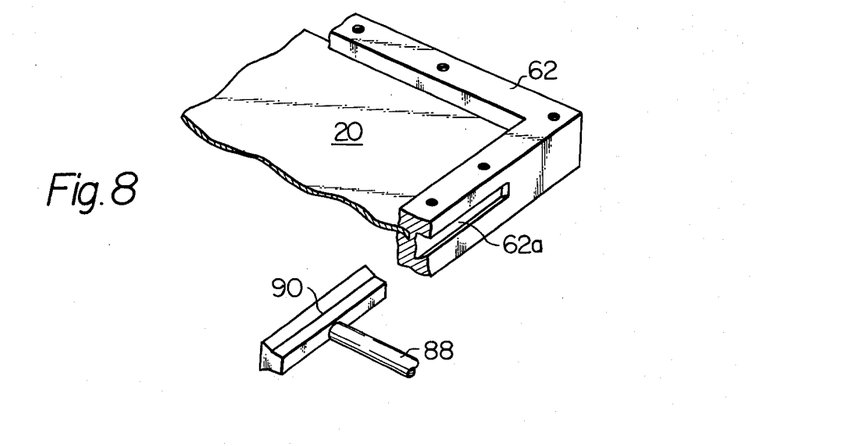
FIG. 8 is a partial exploded view of a table for supporting a microfiche sheet and means for guidably moving the table.

As viewed in FIG. 8, the table 62 is formed with a dovetail-section slot 62a in which the bar 90 is slidably received. A rod 92 and bar 94 are associated with the actuator 56 in an identical manner. The supports 58 and 60 are associated with rods 96 and 98 which are longitudinally slidable therein and have bars 100 and 102 fixed to their ends which are received in slots (not shown) in the table 62.

To move the table 62 and thereby the sheet 20 horizontally as viewed in FIG. 4, the coil 86 of the actuator 54 is energized to move the sleeve 84, rod 88 and bar 90 for example rightward. This pulls the table 42 rightward and with it the bar 100 and rod 96. The table 62 is guided by the bars 102 and 94 on which it slides. In an essentially similar manner the table 62 is moved leftward by energizing the coil 86 with the opposite polarity. The table 62 is moved vertically by means of the actuator 56.

The device 50 may be operated in several ways. As shown, each of the 64 switches (not designated) on the switch panel 76 corresponds to one of the display segments or classes of characters. The operator pushes the switch corresponding to the class of the character he wishes to input to the electric typewriter or the like and the sheet 20 is moved so that the 64 characters of that class are displayed on the screen 70 as described above. The operator then pushes the switch 74 next to the character for input and an electric signal having a code corresponding to the character is produced and fed to the typewriter. In another version of the device, the switch panel 76 is replaced by a single switch and one of the classes serves as an index listing the other classes. Upon pushing of the switch the class serving as the index is displayed on the screen 70. The operator then pushes the switch 74 next to the designation of the class of the character he wants to input and that class subsequently appears on the screen 70. The operator then pushes the switch 74 next to the particular character to input the same to the typewriter.

An electrical control system 112 for the device 50 will now be described with reference to FIG. 10. In the drawing the electric typewriter is shown and designated as 110. The control system 112 comprises a central processing unit (CPU) 114 which has access to the contents of a memory unit such as a read only memory (ROM) 116. The central processing unit 114 is connected to the typewriter 110 and feeds a binary output thereto designating the characters to type.

The central processing unit 114 is also connected to a switch control circuit 118 which is connected to the switch panel 76 and switches 74. The central processing unit 114 is also connected to a table control circuit 120 which is connected to the coils of the actuators 54 and 56. A start switch 122 is also connected to the central processing unit 114.

In operation, the operator pushes the start switch 122 which feeds a start signal (S) to the central processing unit 114, which in turn feeds the start signal (S) to the table control circuit 120. The start signal (S) causes the table control circuit 120 to energize the coils of the actuators 54 and 56 to move the table 62 to an initial or starting position. The operator then pushes one of the switches on the switch panel 76 which corresponds to the class of characters comprising the character he wants to input to the typewriter 110. The switch control circuit 118, in response to the pushing of the switch on the switch panel 76, feeds signals (u) and (v) to the central processing unit 114 indicating the vertical and horizontal position the table 62 must be moved to in order to display the desired class. The central processing unit 112 then feeds corresponding horizontal and vertical control signals (x) and (y) to the table control circuit 120 along with a data set signal (D). The table control circuit 120 then energizes the coils of the actuators 54 and 56 to move the table 62 to the designated position. The sensors 24, 26, 28 and 30 sense the position of the table 62 and feed control signals to the table control circuit 120 as will be described below. The desired class of characters is thereby displayed on the screen 70.

The operator then pushes the switch 74 next to the character displayed on the screen 70 which he wants to input into the typewriter 110. The switch control circuit 118 then produces signals (u) and (V) corresponding to the horizontal and vertical position of the switch 74 depressed and a signal (INT) and feeds the same to the central processing unit 114. The central processing unit 114, after receiving the signals (u) and (v) satisfactorily, feeds a signal (F) to the switch control unit 118. The central processing unit 114 then feeds the signals (u) and (v) into the read only memory 116 which feeds back to the central processing unit 114 a binary code representing the selected character. The central processing unit 114 then feeds this code into the typewriter 110 which prints the character.

As mentioned above, another embodiment is possible in which the switch panel 76 is omitted. In this case, the operator first presses the start switch 122 which feeds the start signal (S) to the central processing unit 114. The central processing unit 114 then feeds to the table control circuit 120 the data set signal (D). The central processing unit 114 also feeds to the control circuit 120 signals ($x_o$) and ($y_o$) representing the position of the table 62 at which a class of characters constituting an index of the other classes is displayed on the screen 70. The control circuit 120 then moves the table 62 to said position in the manner described above so that the index is displayed. The operator then pushes the switch 74 next to the entry in the index representing the class of characters containing the character he wishes to input into the typewriter 110. The switch control circuit 118 then feeds signals ($u$) and ($v$) representing the position to which the table 62 must be moved to display the desired class to the central processing unit 114. The central processing unit 114 then feeds the control signals (x) and (y) to the table control circuit 120 along with the data set signal (D) to move the table 62 to the desired position. The operator then pushes the switch 74 next to the desired character on the screen 70 to output the code to the typewriter 110 in the manner described above. It will be noted that in this case the switches 74 serve the dual function of selecting the desired class and the desired character within the class.

Figure 12:
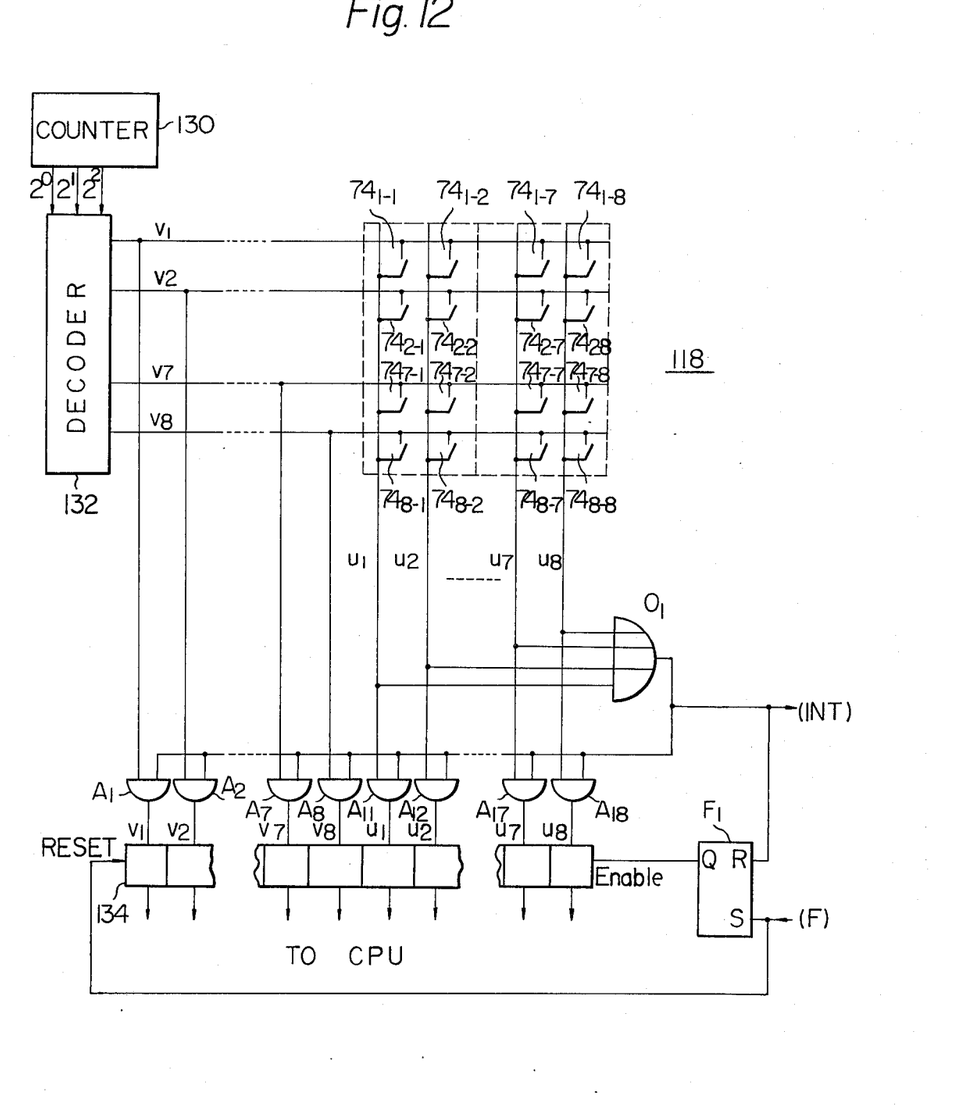
FIG. 12 is a diagram of part of the control system in more detail.

The switch control circuit 118 will now be described with reference to FIG. 12. The switch control circuit 118 comprises a ring counter 130 adapted to count from 0 to 7 (binary). The outputs of the counter 130 designated $2^0$, $2_1$ and $2^2$ are fed into a decoder 132 which produces sequential outputs $V_1$ to $V_8$ (the outputs $V_3$ to $V_6$ are not shown for simplicity of illustration) in response to the counting operation of the ring counter 130.

The switches 74 are here designated as $74_{1-1}$ to $74_{8-8}$ corresponding to the respective 64 character positions on the screen 70. The switches 74 are normally open pressure sensitive switches and are connected between the lines $V_1$ to $V_8$ and lines $U_1$ to $U_8$. The connections may be represented in the following manner by the subscript numerals of the switch 74 designations.

The switches 74 are designated as $74_{f-g}$, where (f) is the subscript number of the line $V_1$ to $V_8$ to which the respective switch is connected and (g) is the subscript number of the line $U_1$ to $U_8$ (only the lines $U_1$, $U_2$, $U_7$ and $U_8$ are shown) to which the switch is connected. For example, the switch $74_{2-7}$ is connected between the lines $V_2$ and $U_7$ ($f=2$, $g=7$).

The 8 lines $V_1$ to $V_8$ are connected to inputs of AND gates $A_1$ to $A_8$ respectively (only the AND gates $A_1$, $A_2$, $A_7$ and $A_8$ are shown), and the lines $U_1$ to $U_8$ are connected to inputs of AND gates $A_{11}$ to $A_{18}$ respectively (only the AND gates $A_{11}$, $A_{12}$, $A_{17}$ and $A_{18}$ are shown). The outputs of the AND gates $A_1$ to $A_8$ and $A_{11}$ to $A_{18}$ are connected to respective parallel inputs of a buffer register 134. The parallel outputs of the buffer register 134 are connected to the central processing unit 114 and constitute the signals (u) and (v).

The lines $U_1$ to $U_8$ are all connected to inputs of an OR gate $O_1$, the output of which is connected to inputs of all of the AND gates $A_1$ to $A_8$ and $A_{11}$ to $A_{18}$ and also to the central processing unit 114 constituting the signal (INT). The output of the OR gate $O_1$ is also connected to a reset input of a flip-flop $F_1$, the set input of which is connected to the central processing unit 114 to receive the signal (F). The reset input of the buffer register 134 is also connected to receive the signal (F), and the (Q) output of the flip-flop $F_1$ is connected to an enable input of the shift register 134.

Figure 10:
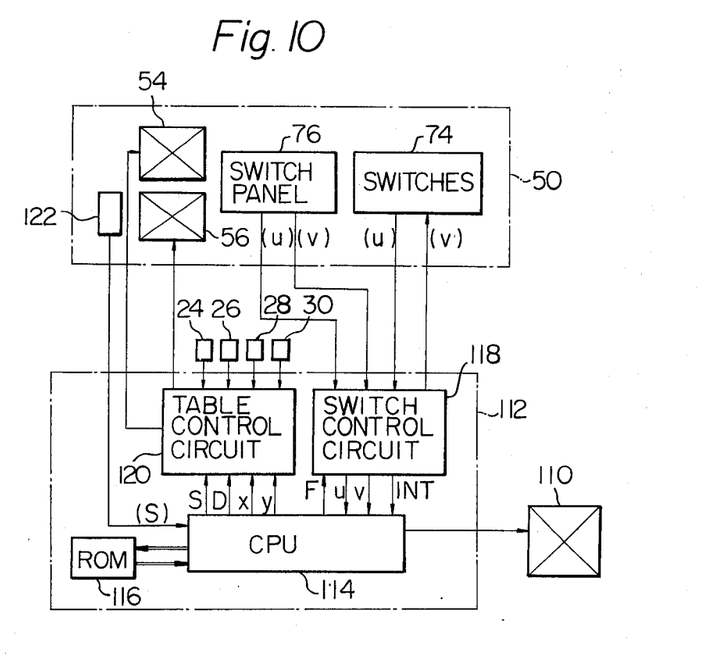
FIG. 10 is an electrical schematic diagram of means for selecting a displayed character and producing an electrical signal corresponding thereto.

Although the switches of the switch panel 76 are not shown in FIG. 10, they are, if provided, connected in parallel with the switches 74 through appropriate buffering gates.

In operation, the shift register 134 is cleared (reset) by the signal (F) from the central processing unit 114 during a previous operation. The signal (F) also sets the flip-flop $F_1$ so that the output thereof is high to enable the shift register 134. The counter 130 is continually cycling at a high rate of speed so that the outputs of the decoder 132 on the lines $V_1$ to $V_8$ are sequentially high. As long as the switches 74 remain open (unpressed), the output of the OR gate $O_1$ will be low and the AND gates $A_1$ to $A_8$ and $A_{11}$ to $A_{18}$ will be inhibited. The low output of the OR gate $O_1$ applied to the reset input of the flip-flop $F_1$ causes the flip-flop $F_1$ to continue to produce a high output to enable the shift register 134.

When the operator pushes (closes) one of the switches 74, a logical "1" will be produced from one of the AND gates $A_1$ to $A_8$ designating the row of the switch 74 pressed and a logical "1" will be produced from one of the AND gates $A_{11}$ to $A_{18}$ to designate the column of the switch 74 depressed and set into the buffer register 134 in the following manner.

It will be assumed for the purpose of example that the switch $74_{1-7}$ is closed. The high signal on the line $V_1$ will have no effect since there is no closed conduction path therefrom to any of the lines $U_1$ to $U_8$, and therefore the output of the OR gate $O_1$ will be low and all of the AND gates $A_1$ to $A_8$ and $A_{11}$ to $A_{18}$ will be inhibited. In response to the subsequent high signal on the line $V_2$, since the switch $74_{2-7}$ is closed the high signal will be conducted therethrough to the line $U_7$ and applied to the OR gate $O_1$. The OR gate $O_1$ will produce a high output which will enable the AND gates $A_1$ to $A_8$ and $A_{11}$ to $A_{18}$. Since the inputs to the AND gates $A_2$ and $A_{17}$ are high (the signals on the lines $V_2$ and $U_7$ are high), the AND gates $A_2$ and $A_{17}$ will produce high outputs which are set into the buffer register 134. The high output of the OR gate $O_1$ is also fed to the central processing unit 114 as the signal (INT) and to the flip-flop $F_1$ to reset the same and prevent further data entry into the buffer register 134. After the central processing unit 114 has read the data in the buffer register 134, it feeds the signal (F) to the switch control circuit 118 which will set the flip-flop $F_1$ and reset the buffer register 134. The low output of the or gate $O_1$ will prevent further entry of data into the buffer register 134 until one of the switches 74 is pressed again.

Figure 11:
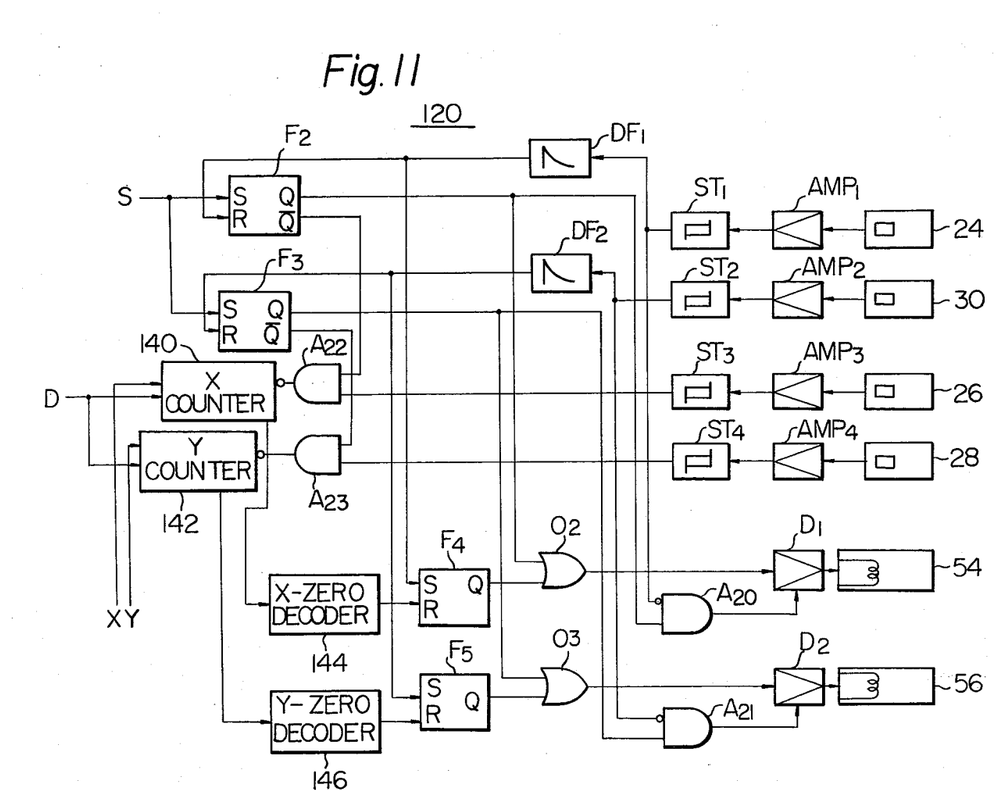
FIG. 11 is a block diagram of an electrical control system constituting part of the device.

The control circuit 120 will now be described with reference to FIG. 11. The control circuit 120 comprises flip-flops $F_2$ and $F_3$ which have set inputs connected to receive the set signal (S) from the central processing unit 114. The (Q) outputs of the flip-flops $F_2$ and $F_3$ are connected to inputs of AND gates $A_{20}$ and $A_{21}$ respectively, the outputs of which are connected to drivers $D_1$ and $D_2$ for the actuators 54 and 56 respectively. The Q outputs of the flip-flops $F_2$ and $F_3$ are connected to inputs of AND gates $A_{22}$ and $A_{23}$, the outputs of which are connected to inverting inputs of an x-counter 140 and a y-counter 142 respectively. The sensors 26 and 28 are connected to other inputs of the AND gates $A_{22}$ and $A_{23}$ through amplifiers $AMP_3$ and $AMP_4$ and Schmitt triggers $ST_3$ and $ST_4$ respectively. The outputs of the sensors 24 and 30 are connected through amplifiers $AMP_1$ and $AMP_2$ and Schmitt triggers $ST_1$ and $ST_2$ to inverting inputs of the AND gates $A_{20}$ and $A_{21}$ and through differentiators $DF_1$ and $DF_2$ to reset inputs of the flip-flops $F_2$ and $F_3$ respectively.

The x- and y-counters 140 and 142 are down-counters and are connected to receive the ignals (x) and (y) from the central processing unit 114 respectively as initial values. The counters 140 and 142 also receive the data set signal (D) as an enabling signal. An x-zero decoder 144 and a y-zero decoder 146 are connected to the counters 140 and 142 to sense the counts of zero therein respectively. The outputs of the decoders 144 and 146 are connected to reset inputs of flip-flops $F_4$ and $F_5$ respectively. The outputs of the differentiators $DF_1$ and $DF_2$ are connected to the respective set inputs of the flip-flops $F_4$ and $F_5$. The (Q) outputs of the flip-flops $F_2$ and $F_4$ are connected to inputs of an OR gate $O_2$, the output of which is connected to the driver $D_1$. The (Q) outputs of the flip-flops $F_3$ and $F_5$ are connected to inputs of an OR gate $O_3$, the output of which is connected to the driver $D_2$.

In operation, the central processing unit 114 applies the start signal (S), the data set signal (D) and the position signals (x) and (y) to the control circuit 120. The start signal (S) sets the flip-flops $F_2$ and $F_3$. The data set signal (D) enables the counters 140 and 142 so that the values of (x) and (y), which vary from 1 to 8, are set into the respective counters 140 and 142. Referring also to FIG. 3, it will be seen that the sensors 24 and 30 are associated with the dark portions 32 and 38 of the microfiche sheet 20 respectively. The sensors 24, 26, 28 and 30 are preferably photoelectric units comprising a light source and receiver, and are not shown in detail. The sheet 20 is so arranged that when the sheet 20 is in an operative position in which characters are displayed on the screen 70, the dark portions 32 and 38 will be adjacent to the sensors 24 and 30 respectively so that the sensors 24 and 30 will produce low outputs. The sheet 20 is further movable to the initial or start position as described above which is the lower rightmost position of the sheet 20. In this position, the sensors 24 and 30 are above the upper left corners of the dark portions 32 and 38 respectively so that the sensors 24 and 30 produce high outputs. It will be assumed that the signals (S) and (D) are received by the control circuit 120 and that the sheet 20 is in an operative position.

Since the sensors 24 and 30 produce low outputs, which are shaped by the schmitt triggers $ST_1$ and $ST_2$, the AND gates $A_{20}$ and $A_{21}$ are enabled. The flip-flops $F_2$ and $F_3$ produce high (Q) outputs which are also applied to the AND gates $A_{20}$ and $A_{21}$, which apply high outputs to the drivers $D_1$ and $D_2$ respectively. The outputs of the AND gates $A_{20}$ and $A_{21}$ serve to determine the polarity of the voltage applied from the drivers $D_1$ and $D_2$ to the actuators 54 and 56 and thereby the direction of movement of the table 62 and sheet 70. High outputs designate rightward and downward movement and low outputs designate upward and leftward movement.

The high outputs of the flip-flops $F_2$ and $F_3$ are also applied through the OR gates $O_2$ and $O_3$ to the drivers $D_1$ and $D_2$. These outputs are enabling inputs for the drivers $D_1$ and $D_2$. In response to the enabling and high level direction designation inputs, the drivers $D_1$ and $D_2$ energize the actuators 54 and 46 to drive the table 62 and sheet 70 to the lower rightmost starting position.

As this position is reached, the dark portions 32 and 38 move away from the sensors 24 and 30 so that the sensors 24 and 30 produce high outputs. These are differentiated by the differentiators $DF_1$ and $DF_2$ so that short pulses are applied to the reset inputs of the flip-flops $F_2$ and $F_3$ to reset the same. The (Q) outputs of the flip-flops $F_2$ and $F_3$ become low thereby inhibiting the AND gates $A_{20}$ and $A_{21}$, which in turn produce low outputs designating leftward and upward movement of the table 62. The output of the differentiators $DF_1$ and $DF_2$ also set the flip-flops $F_4$ and $F_5$, which apply high signals to the drivers $D_1$ and $D_2$ through the OR gates $O_2$ and $O_3$ to enable the drivers $D_1$ and $D_2$ and move the table 62 upward and leftward from the starting position.

It will be recalled that the (x) and (y) values of the required position of the table 62 were set into the counters 140 and 142. The stripped portions 34 and 36 of the sheet 20 are arranged relative to the sensors 26 and 28 so that movement of the striped portions 34 and 36 will cause the sensors 26 and 28 to produce pulse outputs. More specifically, the dark stripes corresponds to the predetermined positions of the table 62 in the vertical and horizontal directions, and whenever a dark stripe is adjacent to a sensor 26 or 28 the sensor 26 or 28 will produce a high output. These high outputs are applied to the counters 140 and 142 to decrement the same. When the table 62 has been moved to the required position, it will be understood that the required number of stripes of the striped portions 32 and 36 have passed the respective sensors 26 and 28 which have produced the same number of pulses to decrement the counters 140 and 142. The signals (x) and (y) are therefore binary codes which designate how many positions in the vertical and horizontal directions the table 62 must move from the lower rightmost starting position to reach the required position.

When the table 62 has reached the required position, the count in the counters 140 and 142 is reduced to zero, and the decoders 144 and 146 produce high outputs which reset the flip-flops $F_4$ and $F_5$. The low outputs of the flip-flops $F_4$ and $F_5$ inhibit the drivers $D_1$ and $D_2$ so that the actuators 54 and 56 are de-energized and the table 62 is stopped in the required position.

Figures 13, 14, 15, 16, 17:
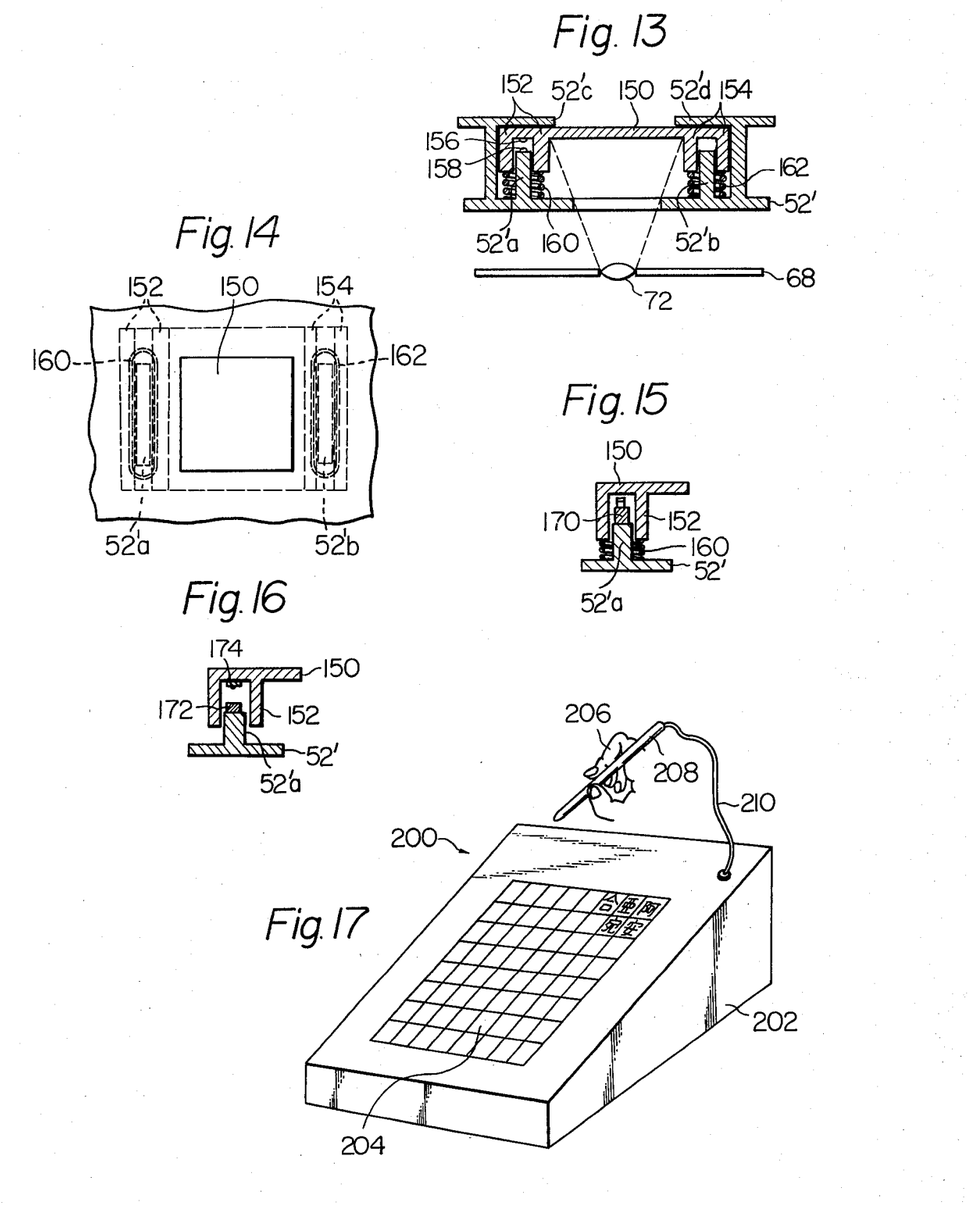
FIG. 13 is a sectional view of a character selection switch.
FIG. 14 is an overhead sectional view of the switch shown in FIG. 13.
FIG. 15 and 16 show alternative embodiments of the switch shown in FIG. 13.
FIG. 17 is a perspective view of another embodiment of the present invention.

An alternative embodiment of the switches 74 is shown in FIGS. 13 and 14. Rather than providing a continuous screen 70, the embodiment shown comprises 64 transluscent switch plates 150 which serve as individual screens for the characters and also movable switch members. Each switch plate 150 is provided with extension bars 152 and 154 having U-shaped cross sections. Extension bars 52'a and 52'b of the housing 52' extend into the U-shaped hollows of the extensions 152 and 154 to guide the switch plate 150 for vertical movement. A switch contact 156 is provided to the extension 152 and a switch contact 158 is provided to the bar 52'a. Compression springs 160 and 162 urge the switch plate 150 upward to abut against stop members 52'c and 52'd of the housing 52'. In operation, an image of the character is projected onto the switch plate 150 and is visible to the device operator. To designate the character, the operator simply pushes down the switch plate 150 to engage the contacts 156 and 158. This embodiment is advantageous from the standpoint of human engineering in that the operator presses what appears to be an image of the character itself instead of just a switch, so that the chance of erroneous input of data is reduced.

In FIGS. 15 and 16 the same switch plata 150 is used, but the switch contacts are different. FIG. 15 teaches the use of a pressure sensitive switch 170 which is closed when the switch plate 150 is pushed thereagainst. FIG. 15 shows a Hall effect element 172 actuated by a magnet 174 fixed to the switch plate 150.

Another embodiment of the invention is shown in FIG. 17 as a device 200. The device 200 is identical to the device 50 except for the circuitry for selecting the desired character and comprises a housing 202 formed with a screen 204 identical to the screen 70. A light pen 208 is shown as being held by a hand 206, and is connected to the circuitry inside the housing 202 by a cord 210.

Figure 18:
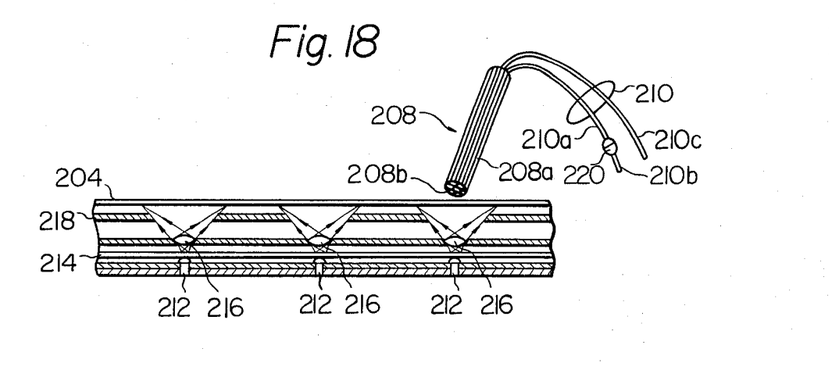
FIG. 18 is a partial sectional view of the device shown in FIG. 17 comprising a light pen for selecting a character.

FIG. 18 shows the housing 202 and screen 204. Also shown are optical fibers 212, a microfiche sheet 214, lenses 216 and a mask 218 which serve the same functions as in the previous embodiment. The light pen 208 comprises a body 208a which supports at its end a pressure sensitive switch 208b. The cord 210 comprises a lead 210c which is connected to the switch 208b and an optical fiber tube 210a whose end is disposed next to the pressure sensitive switch 208b. The other end of the tube 210a is connected to a photoelectric element 220 which is adapted to generate an electric signal on a lead 210b in response to light.

The embodiment of FIGS. 17 to 20 differs from the previous embodiment in that rather than having a single light source for all of the characters, each optical fiber tube 212 is provided with its own light source such as a light emitting diode which may be energized individually. From the standpoint of human engineering, it is desirable for the operator to have feedback, i.e., an indication that the character he selected was actually fed into the typewriter or similar device. In the present embodiment, the light source to the input character is shut off so that the particular character selected is blanked out on the screen 204. The electrical circuit for this embodiment will be described with reference to FIG. 19 and the timing diagram of FIG. 20.

Figure 19:
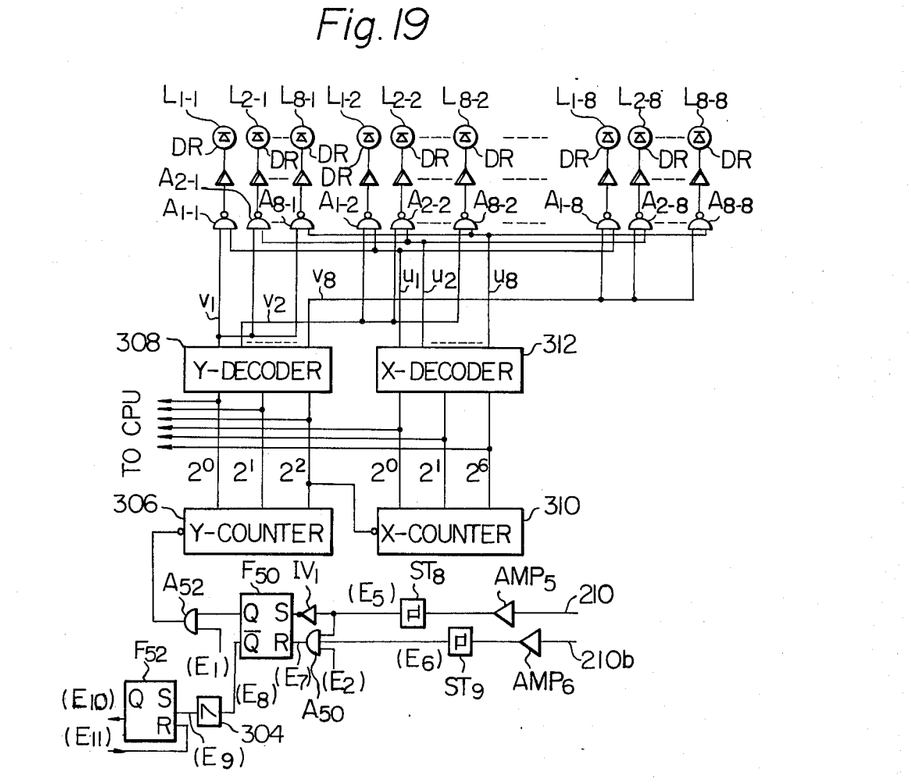
FIG. 19 is a partial electrical circuit diagram of a control system for the embodiment shown in FIG. 17.

In FIG. 19, the lead 210c from the pressure sensitive switch 208b and the lead 210b from the photoelectric element 220 of the light pen 208 are connected to inputs of amplifiers $AMP_5$ and $AMP_6$ respectively, the outputs of which are connected to inputs of Schmitt triggers $ST_8$ and $ST_9$ respectively. The outputs of the Schmitt triggers $ST_8$ and $ST_9$ are connected to inputs of an AND gate $A_{50}$. The output of the Schmitt trigger $ST_8$ is also connected through an inverter $IV_1$ to a set input of a flip-flop $F_{50}$. The output of the AND gate $A_{50}$ is connected to a reset input of the flip-flop $F_{50}$. Clock pulses designated as ($E_2$) are produced by the central processing unit 114 and are applied to another input of the AND gate $A_{50}$. The (Q) output of the flip-flop $F_{50}$ is connected to an input of an AND gate $A_{52}$, another input of which is connected to receive clock pulses designated as ($E_1$) from the central processing unit 114. The (Q) output of the flip-flop $F_{50}$ is connected through a differentiator 304 to the set input of a flip-flop $F_{52}$, the reset input of which is connected to receive a pulse ($E_{11}$) from the central processing unit 114. The (Q) output of the flip-flop $F_{52}$ is connected to the central processing unit 114 and feeds a signal ($E_{10}$) thereto.

The output of the AND gate $A_{52}$ is connected to an inverting count input of a Y-counter 306, which functions as a binary ring counter counting from 0 to 7. The counter 306 has $2^0$, $2^1$ and $2^2$ outputs which are connected to inputs of a Y-decoder 308. The $2^2$ output of the counter 306 is connected to an inverting input of an X-counter 310 which is identical to the counter 306. This $2^2$ output functions as a carry output since it triggers the counter 310 when the $2^2$ output goes to zero, this occuring only when the y-counter 310 counts from 7 back to zero. The counter 310 also has $2^0$, $2^1$ and $2^2$ outputs which are connected to inputs of an X-decoder 312. The outputs of the counters 306 and 310 are also connected to the CPU providing an output code for the designated character.

The decoders 308 and 312 have output lines designated as $V_1$ to $V_8$ and $U_1$ to $U_8$ respectively. These lines correspond to the designations of the sections of the screen 70 described with reference to FIG. 3. NAND gates $A_{1-1}$ to $A_{8-8}$ have inputs connected to the lines $V_1$ to $V_8$ and $U_1$ to $U_8$ in a manner which will be described below. The subscript designations of the NAND gated $A_{1-1}$ to $A_{8-8}$ also correspond to FIG. 3. The outputs of the NAND gates $A_{1-1}$ to $A_{8-8}$ are connected through drivers which are all designated as DR to light emitting diodes $L_{1-1}$ to $L_{8-8}$ respectively. Each diode $L_{1-1}$ to $L_{8-8}$ is adapted to illuminate, through a fiber optic tube, one character on the screen 204. The diode $L_{2-8}$, for example, is adapted to illuminate the character in the section $U_2V_8$ of the screen, or the character in the eighth row, second column.

The line $V_1$ is connected to inputs of the NAND gates $A_{1-1}$ to $A_{8-1}$. The line $V_2$ is connected to inputs of the NAND gates $A_{1-2}$ to $A_{8-2}$. The line $V_8$ is connected to inputs of the NAND gates $A_{1-8}$ to $A_{8-8}$. The line $U_1$ is connected to inputs of the NAND gates $A_{1-1}$ to $A_{1-8}$. The line $U_2$ is connected to inputs of the NAND gates $A_{2-1}$ to $A_{2-8}$. The line $U_8$ is connected to inputs of the NAND gates $A_{8-1}$ to $A_{8-8}$. The lines $V_3$ to $V_7$ and $U_3$ to $U_7$ are not shown, along with the corresponding light emitting diodes, for simplicity of illustration, but they are connected in a similar manner.

In operation, the flip-flop $F_{50}$ is normally set and the AND gate $A_{52}$ enabled. The clock pulses ($E_1$) are thereby gated through the AND gate $A_{52}$ to the counter 306. The diodes $L_{1-1}$ to $L_{8-8}$ are normally turned on, and the counters 306 and 310, decoders 308 and 312 and NAND gates $A_{1-1}$ to $A_8$ function as a scanning system to sequentially turn off the diodes $L_{1-1}$ to $L_{8-8}$. In the system shown, the NAND gates $A_{1-1}$ to $A_{8-8}$ sequentially produce low outputs in response to two high inputs in such a manner that the scanning is from top to bottom, left to right. In other words, the diodes $L_{1-1}$ to $L_{1-8}$ (first column) are sequentially turned off, followed by the diodes $L_{2-1}$ to $L_{2-8}$ (second column) and finally the diodes $L_{8-1}$ to $L_{8-8}$ (eighth column). This operation is represented by signal ($E_3$) and ($E_4$) in FIG. 20.

To designate a character for entry into the typewriter or the like, the operator touches the end of the light pen 208 to the portion of the screen 204 on which the selected character appears. The pressure sensitive switch 208b is closed and the amplifier $AMP_5$ and Schmitt trigger $ST_8$ produce a signal ($E_5$) which is applied to the inverter $IV_1$ and the AND gate $A_{50}$. The signal ($E_5$) is inverted by the inverter $IV_1$ and applied to the set input of the flip-flop $F_{50}$. The flip-flop $F_{50}$ is adapted to be triggered by a rising edge of a pulse, and is therefore not effected by the rising edge of the signal ($E_5$) since it is inverted and appears as a falling edge. The signal ($E_5$) does, however, serve to enable the AND gate $A_{50}$.

Figure 20:
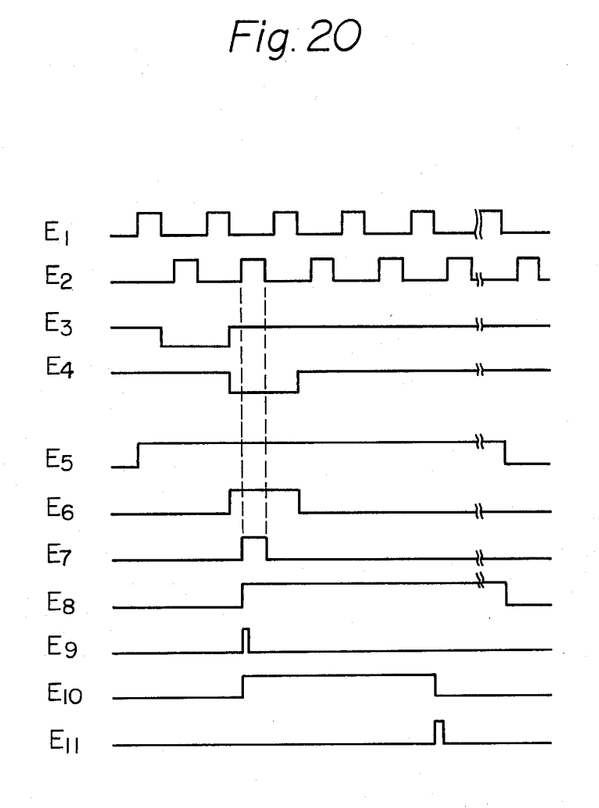
FIG. 20 is a timing chart of electrical signals utilized in the embodiment shown in FIG. 17.

The amplifier $AMP_6$ and Schmitt trigger $ST_9$ are adapted to produce a high output when the light pen 208 senses no light, or when the portion of the screen 204 to which the light pen 208 is touched is blanked by the scanning system. When the particular character portion is blanked, a signal designated as ($E_6$) in FIG. 20 is produced. When the clock pulse ($E_2$), signal ($E_5$) from the pressure sensitive switch 208b and signal ($E_6$) from the light pen 208 in response to the sensed blanking of the character portion of the screen 204 are all applied in coincidence to the AND gate $A_{50}$, the clock pulse ($E_2$) is gated through the AND gate $A_{50}$ to the reset input of the flip-flop $F_{50}$ to reset the same as designated by a signal ($E_7$). The (Q) output of the flip-flop $F_{50}$ goes low, inhibiting the AND gate $A_{52}$. This prevents the application of more clock pulses ($E_1$) to the counters 306 and 310. The counting operation of the counters 306 and 310 is therefore stopped and the counters at 306 and 310 remain at the counts corresponding to the position of the selected character. The NAND gate $A_{1-1}$ to $A_{8-8}$ corresponding to the selected character therefore produces a continuous low output, and the light emitting diode $L_{1-1}$ to $L_{8-8}$ corresponding to the selected character is continuously de-energized. The selected character is therefore continuously blanked on the screen 204 while all of the other characters are continuously illuminated. The device operator therefore knows positively that the character he has designated has been fed to the typewriter or the like.

The (Q) output of the flip-flop $F_{50}$ is designated as ($E_8$), and is differentiated by the differentiator 304 to produce a pulse ($E_9$). This pulse ($E_9$) is applied to the set input of the flip-flop $F_{52}$ to set the same. The output of the flip-flop $F_{52}$ is designated as ($E_{10}$) and is fed to the central processing unit 114. This signal ($E_{10}$) tells the central processing unit 114 that a character has been designated and is ready for entry. The central processing unit 114 inputs the data from the counters 306 and 310 indicating the position of the selected character and then feeds the signal ($E_{11}$) to the reset input of the flip-flop $F_{52}$ indicating that the data has been read. The flip-flop $F_{52}$ is thereby reset as shown in FIG. 20 ($E_{10}$).

After the device operator has been assured that the data has been entered, he removes the light pen 208 from the screen 204. The pressure sensitive switch 208b is opened, and the Schmitt trigger $ST_8$ produces a low output which is inverted by the inverter $IV_1$ and applied to the set input of the flip-flop $F_{50}$. Since this transition appears as the rising edge of a pulse, the flip-flop $F_{50}$ is set and the scanning operation recontinues in the normal manner. It will be understood that the circuit arrangement shown in FIG. 19 is exemplary only, especially in the particular scanning directions disclosed.

A practical device as shown and described can be made in a very compact configuration. When each lens 72 has a diameter of about 2mm, each character on the screen occupying an area of about 3 × 3mm and a screen area of about 220 × 220mm, the device has the overall dimensions of about 520 × 520 by 50mm. The surface of the screen may of course be slanted toward the operator for easier vision.

The present invention will find utility in many areas besides Japanese typewriters. A typical application is the sale of long distance railway tickets which are automatically sold by a vending machine. In this case the various stations can be classified according to route, such as Tokyo to Osaka, with the individual entries of the classes corresponding to the stations on the route, such as Nagoya. The railway customer presses a button marked "Tokyo-Osaka" to designate the class (route) and all of the stations on the Tokyo-Osaka route will be displayed on the screen along with the cost of the tickets. The customer then inserts the proper amount of money into the vending machine and presses the switch next to "Nagoya" on the screen. The machine then prints out an ejects the ticket along with change (if any).

Another typical application is in inventory control for a store or the like. The various products are divided into classes such as "bearings", and either the names or numbers of the products or pictures thereof "needle bearings, journal bearings, etc." are provided on the microfiche as the individual entries. Other typical applications occur in business, banking (calculating interest and the like) and any other areas in which a large amount of information which can be divided into classes must be accessed.

Many modifications will become possible for those skilled in the art after receiving the teachings of the present disclosure without departing from the scope thereof.

What is claimed is:

1. A character display system comprising:
film means on which characters are formed, the characters being divided into a first predetermined number of classes, each class including a maximum of a second predetermined number of the characters;
mask means formed with apertures in a number equal to said second predetermined number;
drive means comprising first and second bi-directional drivers for producing relative movement in first and second mutually perpendicular directions between the film means and mask means to position the film means in a selected one of a third predetermined number of positions relative to the mask means in the first direction and in a selected one of a fourth predetermined number of positions relative to the mask means in the second direction, a product of said third predetermined number and said fourth predetermined number being equal to said first predetermined number, the characters being formed on the film means in an alternating manner in the first and second directions so that at each of the predetermined positions of the film means relative to the mask means the characters of a selected class formed on the film means are aligned with the respective apertures of the mask means for display therethrough;
the film means being further formed with a plurality of stripes extending in the second direction in a number corresponding to said third predetermined number and with a plurality of second stripes extending in the first direction in a number corresponding to said fourth predetermined number:
the drive means comprising:
  first sensor means operatively disposed to sense alignment of any one of the first stripes therewith and produce a first electrical signal in response thereto;
  second sensor means operatively disposed to sense alignment of any one of the second stripes therewith and produce a second electrical signal in response thereto;
  the first bi-directional driver producing relative movement between the film means and mask means in and opposite to the first direction and the second bi-directional driver producing relative movement between the film means and mask means in and opposite to the second direction to an initial position;
class selection means for inputting a code designating the selected class of characters;
computing means for counting the first and second electrical signals produces by the first and second sensors upon relative movement between the film means and mask means from the initial position in the first and second directions and stopping the relative movement when counts of the first and second electrical signals respectively correspond to the code; and
third and fourth sensor means, the film means being formed with first and second portions which are spaced in such a manner as to be out of alignment with the third and fourth sensor means respectively only when the film means and mask means are in the initial position, the computing means being responsive to the third and fourth sensor means and operative to control the first and second bi-directional drivers to produce relative movement between the film means and mask means opposite to the first and second directions until the third and fourth sensors sense that the first and second portions are out of alignment therewith and subsequently control the first and second bi-directional drivers to produce relative movement between the film means and mask means in the first and second directions respectively.

2. The character display system according to claim 1, further comprising:
light source means to illuminate the characters on the film means;

lens means to project images of the characters through the respective apertures of the mask means; and screen means arranged to receive the images of the characters projected through the apertures of the mask means for display.

3. The character display system according to claim 2, in which the light source means comprises a light source and a plurality of fiber optic tubes to transmit light from the light source to the film means, a fiber optic tube being provided for each aperture of the mask means.

4. The character display system according to claim 3, in which the light source comprises a plurality of light emitting diodes, a light emitting diode being provided for each fiber optic tube.

5. The character display system according to claim 2, in which the lens means comprises a plurality of lenses, a lens being provided for each aperture of the mask means.

6. The character display system according to claim 1, in which the film comprises a microfiche sheet.

7. The character display system according to claim 1, further comprising character selection means for selecting a desired character from the selected class of characters and producing an electrical signal corresponding thereto.

8. The character display system according to claim 7 in which the character selection means comprises switches corresponding to the respective apertures of the mask.

9. The character display system according to claim 7, further comprising a plurality of light sources to illuminate the respective characters of the selected class of characters, the character selection means comprising scanning means for normally energizing and sequentially de-energizing the light sources, the character selection means comprising blanking means operative to control the scanning means to continuously energize all of the light sources except the light source corresponding to the selected character and continuously de-energize the light source corresponding to the selected character after the selected character is selected.

10. The character display system according to claim 7, in which the character selection means comprises a light pen.

11. The character display system according to claim 1 in which one of the classes of characters comprises an index listing the other classes of characters.

12. The character display system according to claim 11, in which the index is displayed when the film means and mask means are in the initial position.

13. The character display system according to claim 1, further comprising a table to support the film means, the drive means being operative to move the table.

14. The character display system according to claim 13, in which the drive means comprises electromagnetic actuators to move the table.

15. The character display system according to claim 1, in which the classes of characters comprise a class of Japanese hiragana characters, a class of Japanese katakana characters and a plurality of classes of kanji characters.

16. The character display system according to claim 15, in which the classes of characters further comprise a class of Roman alphabet characters.

17. The character display system according to claim 1, in which the computing means comprises first and second counters having count inputs connected to the first and second sensors respectively, and first and second comparator means for comparing counts of the first and second counters respectively with the code.

* * * * *